United States Patent
Coolbaugh et al.

(10) Patent No.: US 8,230,586 B2
(45) Date of Patent: Jul. 31, 2012

(54) METHOD OF COOLING A RESISTOR

(75) Inventors: Douglas D Coolbaugh, Essex Junction, VT (US); Ebenezer E Eshun, Essex Junction, VT (US); Terence B Hook, Jericho, VT (US); Robert M Rassel, Colchester, VT (US); Edmund J Sprogis, Underhill, VT (US); Anthony K Stamper, Williston, VT (US); William J Murphy, North Ferrisburgh, VT (US)

(73) Assignee: International Business Machines Corporation, Armonk, NY (US)

( * ) Notice: Subject to any disclaimer, the term of this patent is extended or adjusted under 35 U.S.C. 154(b) by 298 days.

(21) Appl. No.: 11/848,263

(22) Filed: Aug. 31, 2007

(65) Prior Publication Data

US 2008/0042798 A1 Feb. 21, 2008

Related U.S. Application Data

(63) Continuation of application No. 10/905,546, filed on Jan. 10, 2005, now Pat. No. 7,310,036, and a continuation of application No. 11/777,389, filed on Jul. 13, 2007, now Pat. No. 7,994,895.

(51) Int. Cl.
    *H01C 7/02* (2006.01)
    *H01C 7/04* (2006.01)
(52) U.S. Cl. .............. 29/612; 29/620; 29/840; 29/842
(58) Field of Classification Search .............. 29/612, 29/620, 825, 840, 842; 257/713, E25.011, 257/E25.013, 718; 338/51, 309, 327, 328, 338/57; 361/718, 712, E25.011, E25.013
    See application file for complete search history.

(56) References Cited

U.S. PATENT DOCUMENTS

| | | | |
|---|---|---|---|
| 4,064,477 A | 12/1977 | Thompson | |
| 4,613,844 A | 9/1986 | Kent et al. | |
| 5,038,132 A | 8/1991 | Lindblom et al. | |
| 5,164,699 A | 11/1992 | Smith et al. | |
| 5,297,006 A * | 3/1994 | Mizukoshi | 361/704 |
| 530,497 A | 4/1994 | Caddock, Jr. | |
| 5,391,914 A | 2/1995 | Sullivan et al. | |
| 5,621,616 A | 4/1997 | Owens et al. | |
| 5,814,536 A * | 9/1998 | Rostoker et al. | 438/122 |
| 584,134 A | 11/1998 | Passaro, Jr. et al. | |
| 5,864,169 A | 1/1999 | Shimura et al. | |
| 594,590 A | 8/1999 | Mazzochette | |

(Continued)

FOREIGN PATENT DOCUMENTS

JP 8-83701 A 3/1996

(Continued)

OTHER PUBLICATIONS

Office Action for corresponding U.S. Appl. No. 11/777,389.

(Continued)

*Primary Examiner* — Thiem Phan
(74) *Attorney, Agent, or Firm* — Anthony Canale; Roberts Mlotkowski Safran & Cole, P.C.

(57) ABSTRACT

A method of cooling a resistor is provided. The method includes forming a first electrical insulator having a high thermal conductivity in thermal contact with an electrically resistive pathway and forming a substrate adjacent the electrical insulator. The method further includes forming a first electrical conductor having a high thermal conductivity within the second substrate and in thermal contact with the electrical insulator.

14 Claims, 10 Drawing Sheets

U.S. PATENT DOCUMENTS

| | | | |
|---|---|---|---|
| 5,955,781 A | 9/1999 | Joshi et al. | |
| 5,990,780 A | 11/1999 | Caddock | |
| 6,201,701 B1 | 3/2001 | Linden et al. | |
| 6,414,847 B1 | 7/2002 | Hutchison et al. | |
| 6,477,054 B1 | 11/2002 | Hagerup | |
| 6,649,937 B2 | 11/2003 | Searls et al. | |
| 6,717,071 B2 | 4/2004 | Chang et al. | |
| 6,861,746 B1 | 3/2005 | Waldvogel et al. | |
| 6,875,950 B2 | 4/2005 | Naumov et al. | |
| 6,933,616 B2 * | 8/2005 | Fang | 257/784 |
| 6,974,952 B2 | 12/2005 | Morooka et al. | |
| 702,224 A1 | 4/2006 | Chinthakindi et al. | |
| 7,042,330 B2 | 5/2006 | Nakamura et al. | |
| 7,061,100 B2 * | 6/2006 | Iwaki et al. | 257/706 |
| 7,070,084 B2 | 7/2006 | Waldvogel et al. | |
| 732,109 A1 | 1/2008 | Sarma et al. | |
| 7,345,364 B2 | 3/2008 | Kerr et al. | |
| 7,365,273 B2 | 4/2008 | Fairchild et al. | |
| 2003/0017836 A1 | 1/2003 | Vishwanathan et al. | |

FOREIGN PATENT DOCUMENTS

| | | |
|---|---|---|
| JP | 2002-503026 A | 1/2002 |
| JP | 92002-503026 | 1/2002 |
| JP | 2003-183580 A | 7/2003 |
| WO | WO9940590 | 8/1999 |

OTHER PUBLICATIONS

Notice of Allowance dated Mar. 25, 2011 in U.S. Appl. No. 11/777,389.

Office Action dated Aug. 8, 2009 in U.S. Appl. No. 11/777,389.

Final Office Action dated Feb. 3, 2010 in U.S. Appl. No. 11/777,389.

Office Action dated Jul. 22, 2010 in U.S. Appl. No. 11/777,389.

Final Office Action dated Dec. 27, 2010 in U.S. Appl. No. 11/777,389.

* cited by examiner

US 8,230,586 B2

METHOD OF COOLING A RESISTOR

CROSS REFERENCE TO RELATED APPLICATIONS

This application is a continuation application of copending U.S. application Ser. No. 10/905,546, filed on Jan. 10, 2005, and U.S. application Ser. No. 11/777,389, filed on Jul. 13, 2007, the contents of which are incorporated by reference in their entirety.

FIELD OF THE INVENTION

The invention relates to heat sinks, and more particularly to heat sinks for integrated circuit devices such as resistors including precision resistors.

BACKGROUND DESCRIPTION

In operation of an integrated circuit, some of the devices in the integrated circuit will generate heat. This is particularly true for some types of devices, including, for example, resistors. Also, some devices in integrated circuits are susceptible to heat and may have certain electrical characteristics negatively influenced by heating. Heating effects can be especially harmful to high precision devices, where the heating effects ruin the precision with which the particular device operates.

For example, a high precision resistor, which is designed to carry a relatively large amount of current, will generate substantial amounts of heat. The heat generated by the precision resistor will heat the resistor itself ("self-heating") thereby altering the resistance of the high precision resistor. The self-heating effects experienced by an integrated circuit device can be further exacerbated by the integrated circuit device being surrounded by a poor heat conductor which impedes heat dissipation. Typically, electrical insulators which also have poor heat conduction properties surround many integrated circuit devices. Thus, the design of many integrated circuit devices increase the devices susceptibility to the negative effects of self-heating.

Accordingly, it may be advantageous for some types of electrical devices within an integrated circuit to be in thermal contact with a heat sink through a thermal conductive path. Additionally, the better the thermal conductor of the conductive path, the more heat may be dissipated by the heat sink, allowing the electrical device to function at higher current levels without destroying itself due to heat. Also an electrical device with a heat sink may better operate within narrow design specifications while conducting large amounts of current.

It should be noted that the best thermal conductors are typically also electrical conductors. Additionally, contacting an electrically conducting thermal conductor to an electrical device and a heat sink will typical short the electrical device to ground. Accordingly, a thermal path is needed which conducts heat well, but does not conduct electricity.

SUMMARY OF THE INVENTION

In a first aspect of the invention, a heat sink includes a first electrical insulator having a high thermal conductivity and configured to contact an electrically resistive pathway and an electrical conductor having a high thermal conductivity arranged in thermal contact with the first electrical insulator.

In another aspect of the invention, a resistor includes an electrically resistive path arranged in a first substrate, and an electrical insulator having a high thermal conductivity arranged in thermal contact with the electrically resistive pathway. The resistor also includes a second substrate arranged adjacent the electrical insulator, and an electrical conductor having a high thermal conductivity arranged in the second substrate and in thermal contact with the electrical insulator.

In another aspect of the invention, a thermal interface in an integrated circuit includes a high thermal conductivity electrical insulator film adjoining a first electrical conductor and a second electrical conductor.

In another aspect of the invention, a method of cooling a resistor includes forming a first electrical insulator having a high thermal conductivity in thermal contact with an electrically resistive pathway, and forming a substrate adjacent the electrical insulator. The method also includes forming a first electrical conductor having a high thermal conductivity within the second substrate and in thermal contact with the electrical insulator.

DETAILED DESCRIPTION OF EMBODIMENTS OF THE INVENTION

The invention relates to, for example, heat sinks for integrated circuit devices such as resistors including precision resistors. In embodiments of the invention, a heat sink contact is arranged next to a conductive substrate or thermal conductor having good thermal conductivity in addition to being able to conduct electricity with a relatively thin layer of high thermal conductivity electrical insulator therebetween. The thermal conductor forms an efficient thermal pathway to a heat sink, and because a high thermal conductivity electrical insulator is interposed between the electrical resistor and heat sink contact, the heat sink contact may be made from a metal or other electrical conductor with good heat conduction properties. This provides good thermal conduction without electrically shorting the electrical resistor to ground. The heat sink contact thermal conductor provides enhanced cooling for the electrical resistor, allowing the electrical resistor to conduct higher levels of current without failure.

Figure 1:
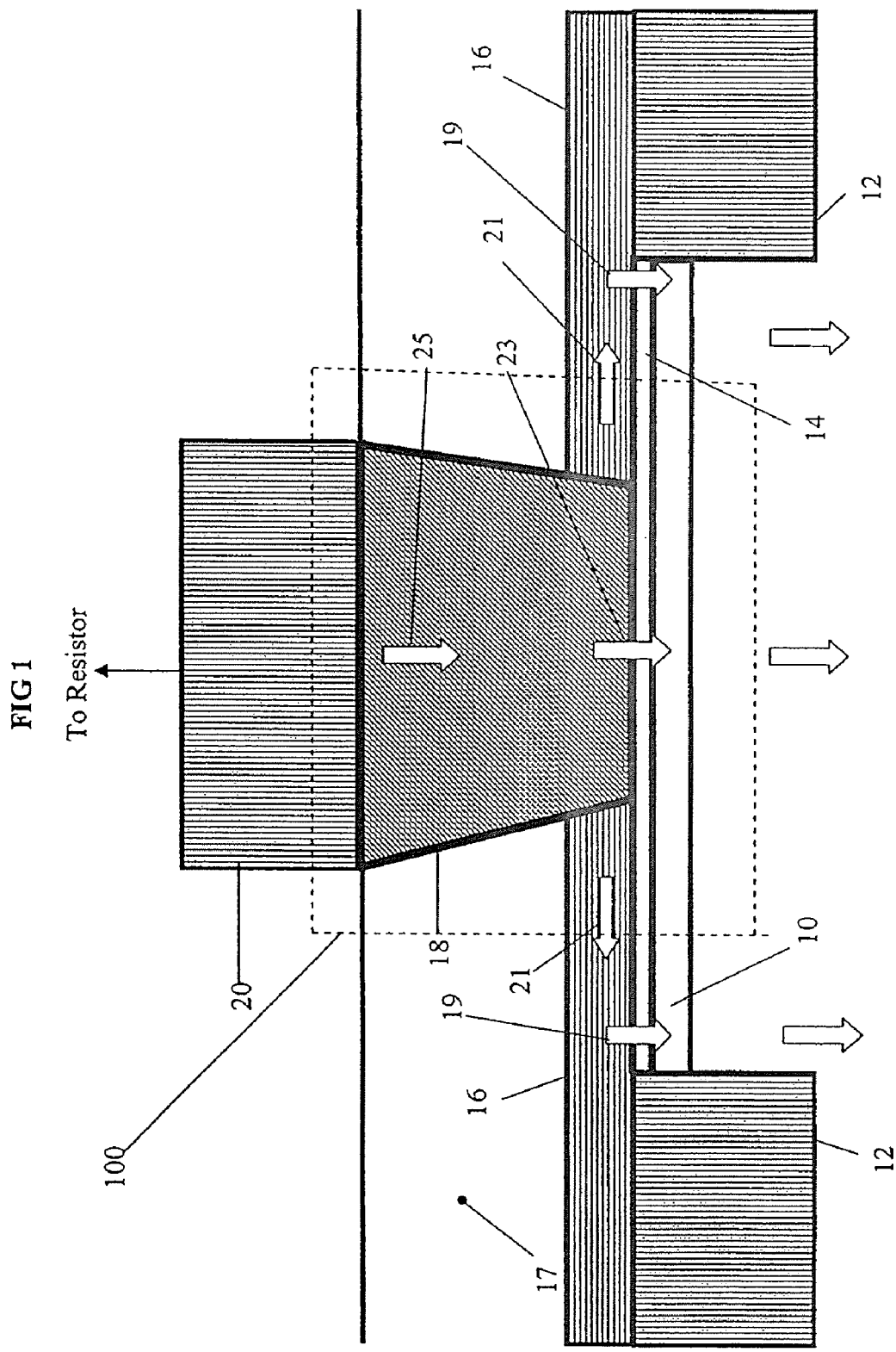
FIG. 1 is a cross-sectional illustration of an embodiment of a resistor connected to a heat sink in accordance with the invention.

Referring to FIG. 1, a heat sink 100 includes a conductive substrate 10 which may be located between two shallow trench insulators 12. The conductive substrate 10 may be formed by any of the methods well known in the art for forming a conductive substrate in a semiconductor such as arranging a polysilicon conductive path on a substrate. The shallow trench isolation 12 may be formed by any of the methods well known in the art for forming shallow trench isolation, such as forming a trench and depositing an oxide in the trench.

A high thermal conductivity electrical insulator (HTCEI) film or layer 14 is formed in thermal contact with the conductive substrate 10. Examples of high thermal conductivity electrical insulator films used in all aspects of the invention include thin layers of, for example, aluminum oxide ($Al_2O_3$), beryllium oxide, (BeO), cerium oxide ($CeO_2$), and cobalt oxide (CoO). Because the HTCEI film 14 is formed in a relatively thin layer, the HTCEI film 14 provides electrical insulation while having a reduced interference with thermal conduction between the conductive substrate 10 and surrounding materials.

A heat sink contact 18 is positioned in thermal contact with the HTCEI film 14. The heat sink contact 18 may be made from a metal such as tungsten or copper and may take the form of a metal filling a via hole. Also adjacent the HTCEI film 14 is a high conductivity insulator 16. The high conductivity insulator 16 surrounds the lower section of the heat sink contact 18, as well as being in thermal contact with the HTCEI film 14. On top of the high conductivity insulator 16 and in contact with sides of the heat sink contact 18, is an electrical insulator 17. The electrical insulator 17 may or may not be a high thermal conductivity material. On top of and in thermal contact with the heat sink contact 18 is a metal contact 20. The metal contact 20 thermally connects the heat sink contact 18 to the circuit device which is cooled by the heat sink 100.

Figure 2:
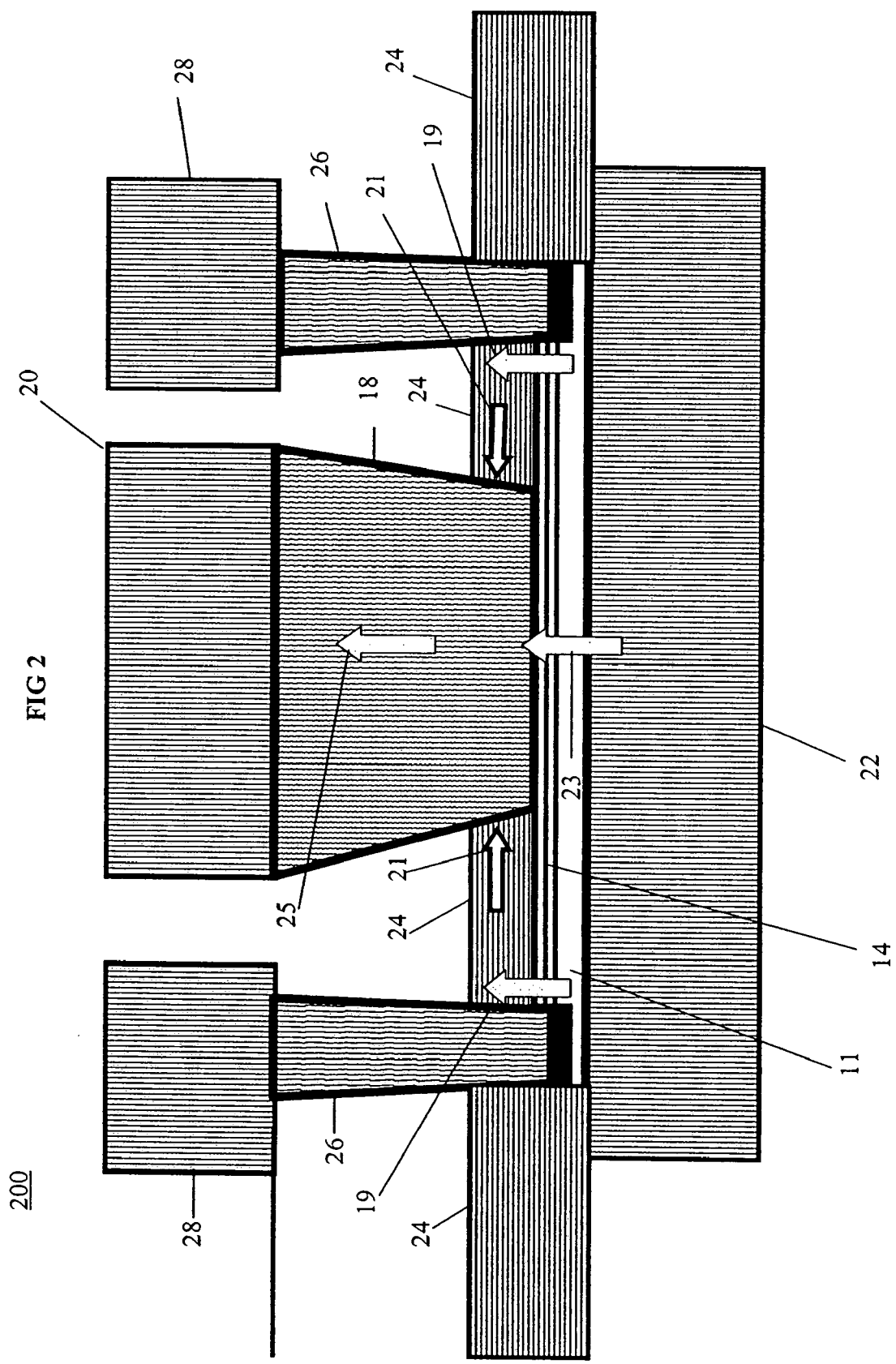
FIG. 2 is a cross-sectional illustration of an embodiment of a resistor connected to a heat sink in accordance with the invention.

Referring to FIG. 2, a resistor structure 200 is shown. Similar to the heat sink 100 of FIG. 1, the resistor structure 200 of FIG. 2 includes a HTCEI film 14 to provide electrical insulation and good thermal conduction. Additionally, the resistor structure 200 includes an electrical resistor 11. On top of the electrical resistor 11 is a HTCEI film 14, and on top of the HTCEI film 14 is a high thermal conductivity insulator 24. Passing through a via hole in the high thermal conductivity insulator 24 is a via metal acting as a heat sink contact 18. The heat sink contact 18 passes through the high thermal conductivity insulator 24 and contacts the HTCEI film 14. On top of the heat sink contact 18 is a metal contact 20 which thermally connects the electrical resistor 11 to the heat sink. The electrical resistor 11 may also include any type of semiconductor device.

At each end of the electrical resistor 11 are electrical contacts 26 which lead to wires 28. The wires 28 and electrical contacts 26 provide the input and output to the electrical resistor 11. The ends of the electrical contacts 26 which are contacting the electrical conductor 11, are surrounded by the high thermal conductivity insulation 24.

In operation, the wires 28 and electrical contacts 26 provide an electrical input and output to the electrical resistor 11. The electrical resistor 11 is heated when current runs therethrough. Heat will then flow from the electrical resistor 11 into the HTCEI film 14, and then into the high thermal conductivity insulator 24 along thermal paths 19. Once in the high thermal conductivity insulator 24, heat will flow towards the heat sink contact 18 along thermal paths 21. Additionally, heat will flow from the electrical resistor 11 through the HTCEI film 14 into the heat sink contact 18 through thermal path 23. Once in the heat sink contact 18, heat will flow into the metal contact 20 along thermal path 25 to a heat sink similar to the heat sink 100 of FIG. 1.

Figure 3:
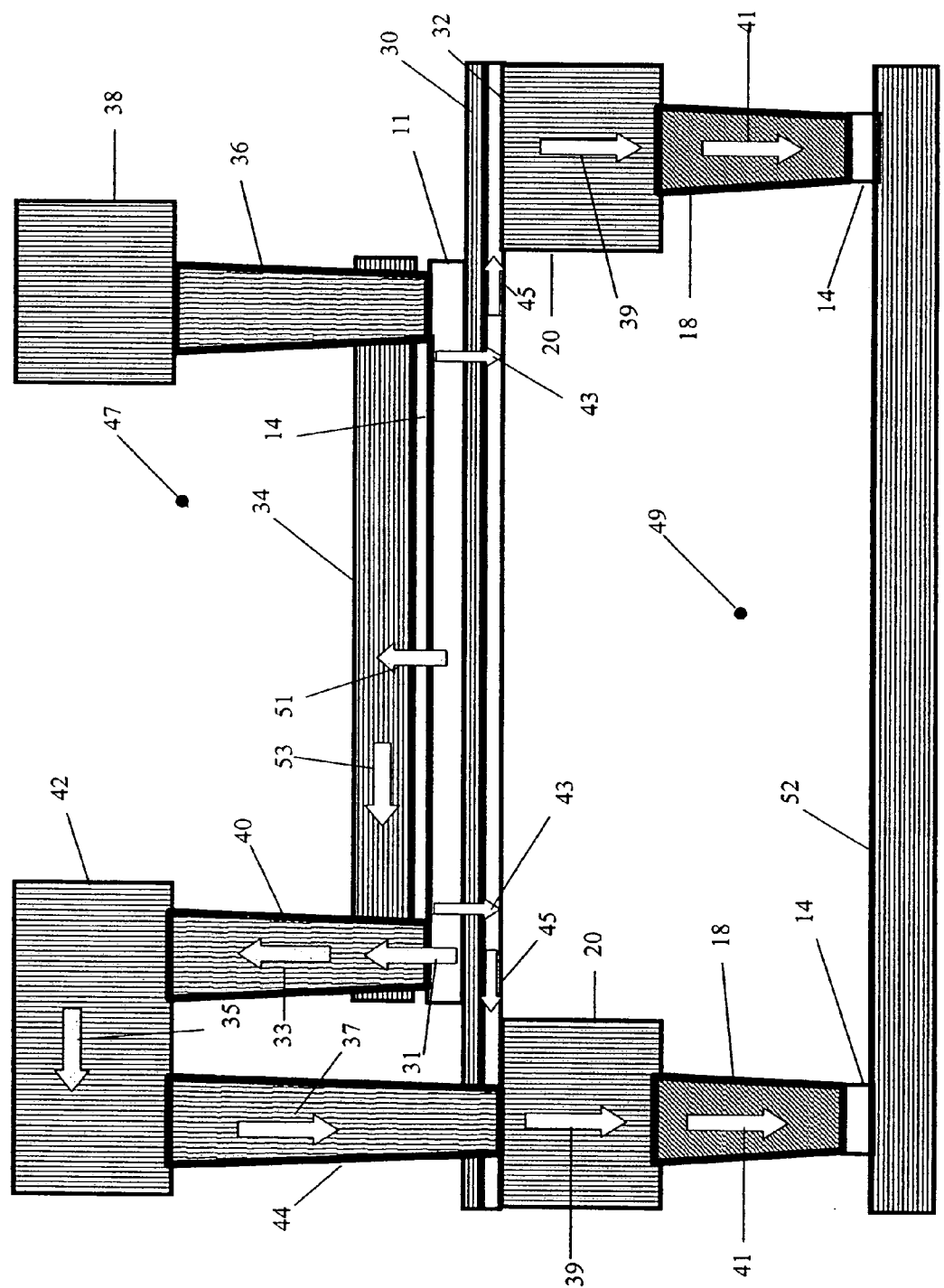
FIG. 3 is a cross-sectional illustration of an embodiment of a resistor connected to a heat sink in accordance with the invention.

Referring to FIG. 3, an embodiment of a heat sink structure for high frequency applications in accordance with the invention is shown. The heat sink structure 300 includes an electrical resistor 11 with a HTCEI film 14 thereon. The electrical resistor 11 may include a poly silicon electrical conductive path, and/or a thin metal film. A high thermal conductivity insulator 30 is arranged under the electrical resistor 11 and on top of a nitride layer 32 (also referred to an insulator). The nitride layer 32 may also be a HCTEI film. A high thermal conductivity insulator 34 is formed on top of the HTCEI film 14 which is surrounded by an interlevel dielectric (ILD) 47. A layer of ILD 49 separates the nitride insulator 32 and the substrate 52 from one another. At one end of the electrical resistor 11 is an electrical contact 36 which is in contact with a metal wire 38.

At an end of the electrical resistor 11 opposite the electrical contact 36 is a heat sink contact 40. The heat sink contact 40 passes through the thick high thermal conductivity layer 34 and is in contact with, and passes through the HTCEI film 14 to make thermal and electrical contact with the electrical resistor 11. On top of the heat sink contact 40 is a metal contact 42. Attached on a bottom of the metal contact 42 and near the heat sink contact 40 is a first thermal conductor 44. (heat sink contact 40 is used both as an electrical contact and also to conduct heat to the heat sink).

The first thermal conductor 44 passes through the high thermal conductivity insulator 30 and the nitride layer 32, and makes thermal contact with a metal contact 20. The metal contact 20 makes thermal contact to the heat sink (100) through heat sink contact 18 in FIG. 1. The first thermal conductor metal contact 20 are made from a high thermal conducting material such as a metal. The structure of the metal contact 20 and heat sink contact 18 and HTCEI film 14 are located at each end of the electrical resistor 11, where the metal contact 20 is in contact with the nitride layer 32.

In operation, current flows from one end of the electrical resistor 11 to the other end through the electrical contact 36 and metal wire 38 at one end and the heat sink 40 and metal contact 42 at the other end. Heat generated by the current flowing through the electrical resistor 11 is conducted into the heat sink contact 40 along thermal paths 31 and 33 and into the metal contact 42 along path 35. After passing through the metal contact 42, heat flows through the first thermal conductor 44 indicated by thermal path 37 into the second thermal conductor 46 indicated by path 39 and 41 to the substrate 52.

Also, during current flow, heat passes from the electrical resistor 11 through the high thermal conductivity insulator 30 along the length of the electrical resistor 11 indicated by the thermal path 43. After passing into the high thermal conductivity insulator 30, the heat passes into the nitride layer 32 and then into the metal contact 20 along thermal path 45. Once in the metal contact 20, the heat flows along the thermal path indicated by arrows 39 and 41 into the substrate 52. The resistor with heat sink 300 has relatively good high current characteristics due to the heat sink at one end of the electrical resistor while maintaining relatively good high frequency response by having a reduced parasitic capacitance and other parasitic effects.

Another thermal path includes heat flowing from the electrical resistor 11 into and through the HTCEI film 14 and into the high thermal conductivity insulator 34 along thermal path 51. Heat then flows along thermal path 53 along the length of the high thermal conductivity insulator 34 into the heat sink contact 40. Additionally, heat may flow along the thin high thermal conductivity layer 14 into the heat sink contact 40. The heat may then be dissipated through the thermal paths denoted by arrows 33, 35, 37, 39 and 41 (shown on the left side of FIG. 3).

Figure 4:
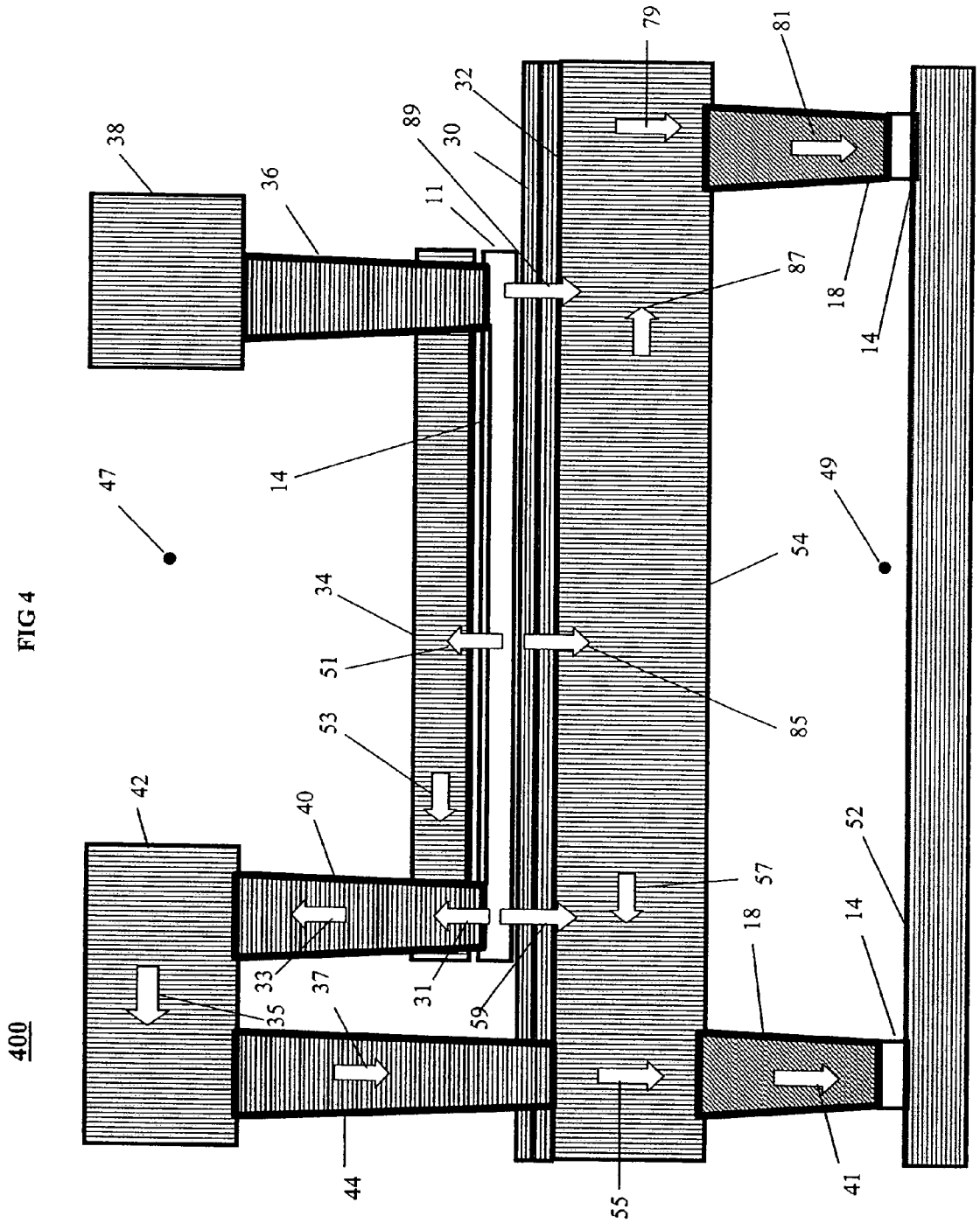
FIG. 4 is a cross-sectional illustration of an embodiment of a resistor connected to a heat sink in accordance with the invention.

Referring to FIG. 4, an embodiment of the resistor with heat sink structure 400 for low frequency applications in accordance with the invention is shown. The resistor with heat sink structure 400 includes an electrical resistor 11 connected to an electrical contact 36 at one end and a heat sink contact 40 at the other end. The electrical resistor 11 is arranged on top of a high thermal conductivity insulator 30 which sits on top of a insulator 32, such as a nitride layer. A HTCEI film 14 is formed on the electrical resistor 11, and a high thermal conductivity insulator 34 is formed on the HTCEI film 14. The electrical contact 36 and the heat sink contact 40 both pass through the high thermal conductivity insulator 34 and HTCEI film 14 to make thermal and electrical contact with the electrical resistor 11.

The nitride layer 32 is arranged on top of a metal substrate 54. The metal substrate 54, in turn, is arranged on top of an ILD layer 49 which is placed upon the top of a substrate 52. The metal substrate 54 is also in thermal communication with the heat sink contact 18. Additionally, an ILD layer 47 is on top of the thick high thermal conductivity insulator 34.

The electrical contact 36 is connected to a metal wire 38 and the heat sink contact 40 is connected to a metal contact 42. Together, the electrical contact 36 and heat sink contact 40 provide an electrical input and output to the electrical resistor 11. In addition to the heat sink contact 40, a first thermal contact 44 is connected to the metal contact 42. The first thermal contact 44 extends through the high thermal conductivity insulator 30 and the nitride layer 32, and is connected to the metal substrate 54. Connected to the bottom of a metal substrate 54 is a heat sink contact 18. The heat sink 18 is connected to the substrate 52 through a HTCEI film 14.

During operation of the resistor 10, heat flows into the heat sink contact 40 along thermal path 31 and then along thermal path 33 into the metal contact 42. Heat may then flow through the metal contact 42 along thermal path 35 and into the first thermal conductor 44. Heat flows through the first thermal conductor 44 along thermal path 37 into the metal substrate 54. Heat may next flow through the metal substrate 54 along thermal path 55 into the heat sink contact 18. Heat then passes through the heat sink contact 18 along heat flow path 41 through the HTCEI film 14 and into the substrate 52.

Additionally, heat may flow from the electrical resistor 11 through the high thermal conductivity insulator 30 and nitride layer 32 into the metal substrate 54 along a heat flow path generally indicated by thermal path 59 and thermal path 89 at opposing ends of the structure. Within the metal substrate 54, heat flows towards each end of the metal substrate 54 along thermal paths 57 and 87 and through the heat sink contact 18 along heat flow paths 41 and 81, respectively. Heat then passes through the HTCEI film 14 into the substrate 52.

Figure 5:
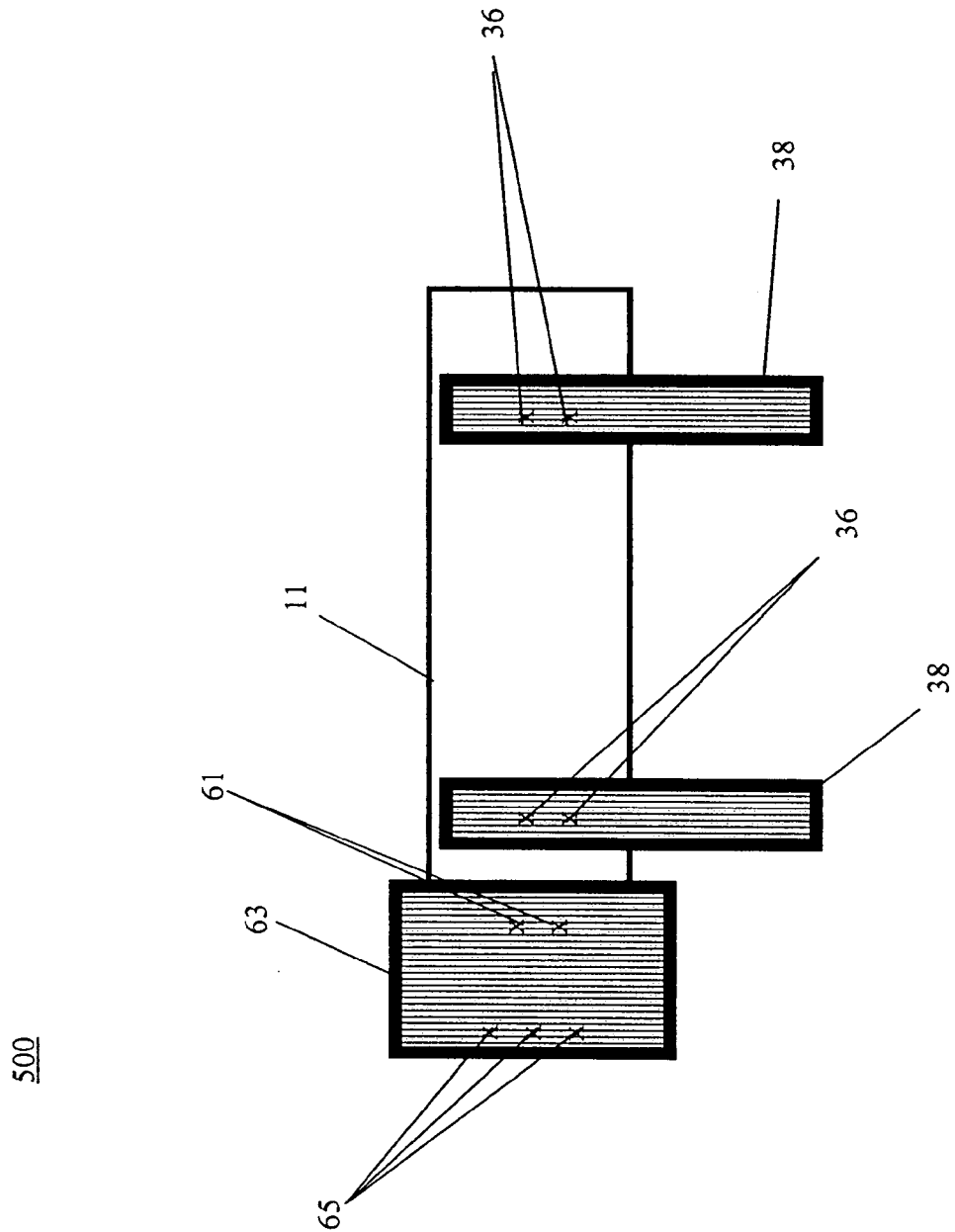
FIG. 5 is a top view illustration of an embodiment of a resistor connected to a heat sink in accordance with the invention.

Referring to FIG. 5, a top view of a resistor and heat sink structure 500 in accordance with the invention is shown. The resistor with heat sink 500 includes an electrical resistor 11. Metal wires 38 at each end of the electrical resistor 11 electrically communicate with the electrical resistor 11 through electrical contacts 36. Metal contacts 38 provide electrical input and output to the electrical resistor 11.

At one end of the electrical resistor 11 is a metal contact 63. The metal contact 63 is in thermal communication with the electrical resistor 11 through heat sink contact 61. Additionally, the metal contact 63 is in thermal communication with a heat sink through thermal paths 65 which are arranged below the metal contact 63.

In operation, electrical contacts 38 provide a path for electrical current to flow into and out of the electrical resistor 11 through electrical contacts 36. The metal contact 63 provides a portion of a thermal path at one end of the electrical resistor 11 in conjunction with the heat sink contacts 61 and thermal path 65 for heat to flow from electrical resistor 11 to a heat sink.

Figure 6:
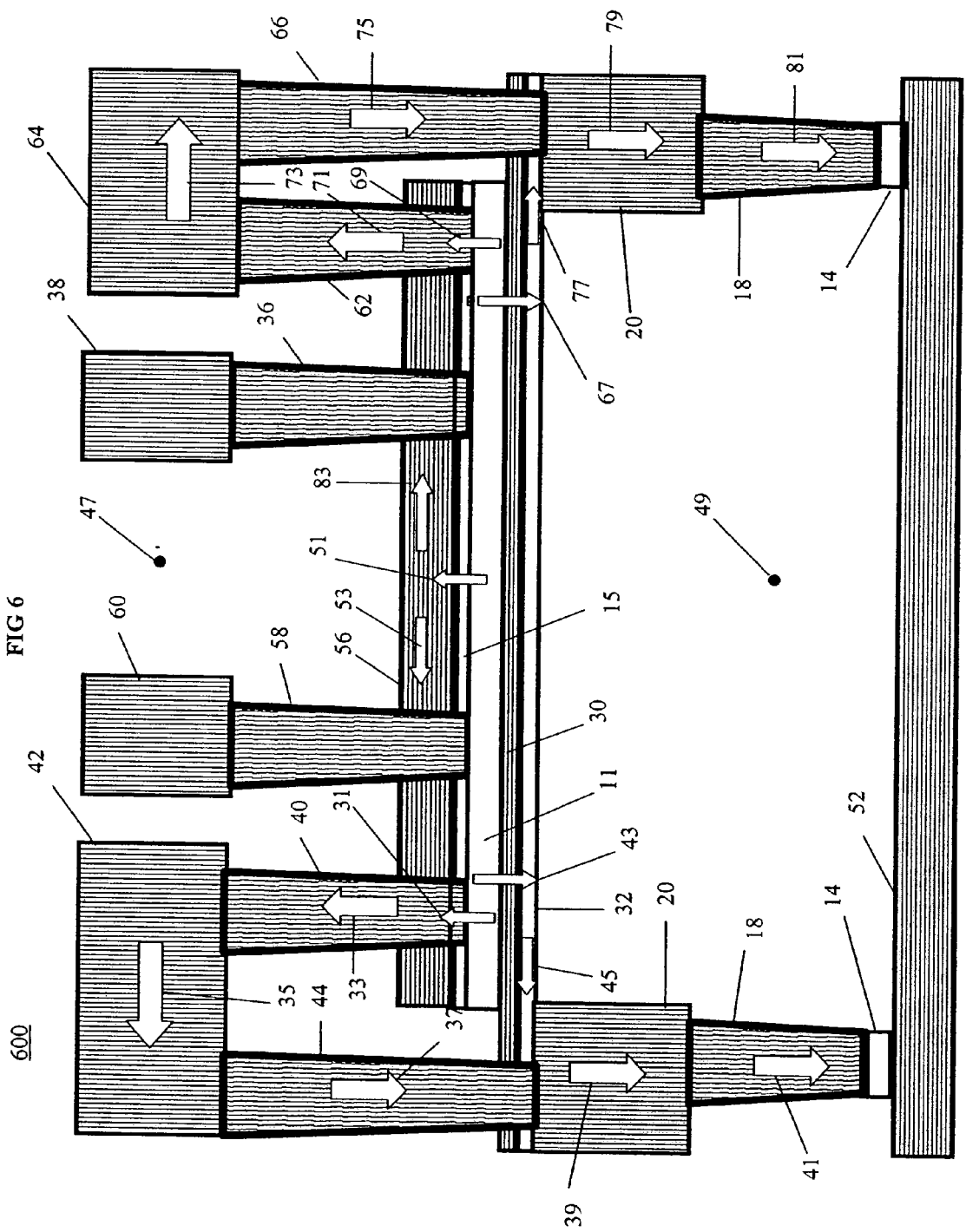
FIG. 6 is a cross-sectional illustration of an embodiment of a resistor connected to a heat sink in accordance with the invention.

Referring to FIG. 6, an embodiment of a resistor with heat sink 600 in accordance with the invention is shown. It should be noted that the resistor with heat sink 600 will have superior high frequency response properties while still maintaining good heat conduction due to the thermal conductive pathways at each end of the electrical resistor.

The resistor with heat sink 600 of FIG. 6 includes an electrical resistor 11 covered by an insulating film 15 such as a nitride film. The insulating film 15 is covered by a high thermal conductivity insulator 56. The electrical resistor 11 is placed upon an insulating substrate 30, which is arranged on top of an electrical insulator 32 such as a nitride film. The electrical insulator 32 is supported at each end by a third thermal conductor 46 and ILD 49. The ILD layer 49 is arranged on top of a substrate 52.

On top of the high conductivity insulator 56 is ILD 47. Electrical contact with the electrical resistor 11 is made by electrical contacts 36 and 58, which pass through the ILD 47, the high conductivity insulator 56 and the insulator 15 to make electrical contact with the electrical resistor 11. The electrical contacts 36 and 58 are also connected to metal wires 38 and 60, respectively (e.g., active resistor contacts similar to the other embodiments). Accordingly, the electrical contacts 36 and 58 provide the electrical input and output to the electrical resistor 11.

Contacting each end of the electrical resistor 11 are heat sink contacts 40 and 62 which are connected to metal contacts, 42 and 64, respectively. The metal contact 42, shown on the left side of FIG. 6, is connected to a heat sink substrate 52 through the thermal conductor 44, and HTCEI film 14. The metal contact 64 is similarly connected to the heat sink substrate 52.

When electrical current passes through the electrical resistor 11, heat generated by the electrical current passes into the surrounding substrates through various thermal paths and into the substrate. For example, heat may flow from an end of the electrical resistor 11 along thermal path 31 into the heat sink contact 40. The heat then flows through contact 40 along thermal path 33 into metal contact 42 where it passes along thermal path 35 into the first thermal conductor 44. In thermal conductor 44, heat follows along path 37 and into the metal contact 20. The heat passes through the thermal path 39 of the metal contact 20 and through the thermal path 41 of the heat sink contact 18 to pass through the HTCEI film 14 and into the substrate 52. A similar heat flow process occurs at the opposite end of the electrical resistor 11, represented by thermal paths 69, 71, 73, 75, 79 and 81 (discussed below).

Additionally, heat from the end of the electrical resistor 11 may flow through the insulating substrate 30 into the nitride layer 32 along thermal path 43. The heat may then flow along the insulating substrate 30 and electrical insulator (e.g., nitride layer) 32 along thermal path 45 into the metal contact 20 and to the substrate 52 along the path already described. A similar heat flow process occurs at the opposite end of the electrical resistor 11, as represented by thermal paths 67, 77, 79 and 81.

Heat may also flow from the electrical resistor 11 into the high thermal conductivity insulator 56 lengthwise along the thermal path 83 towards the heat sink contact 62. Once in the heat sink contact 62, heat may flow along thermal path 71 into the metal contact 64. The heat may then flow along thermal path 73 through the metal contact 64 and through the thermal conductor 66 along thermal path 75. Heat may pass into the metal contact 20 and pass therethrough along thermal path 79 into the heat sink contact 18.

Additionally, heat may flow from the electrical resistor 11 into the insulating substrate 30 and into the nitride layer 32 along thermal path 67. Heat may flow along the insulating substrate 30 and the thermal path 77 toward the thermal conductor 66 and then follow the previously described thermal path to the substrate 52.

Figure 7:
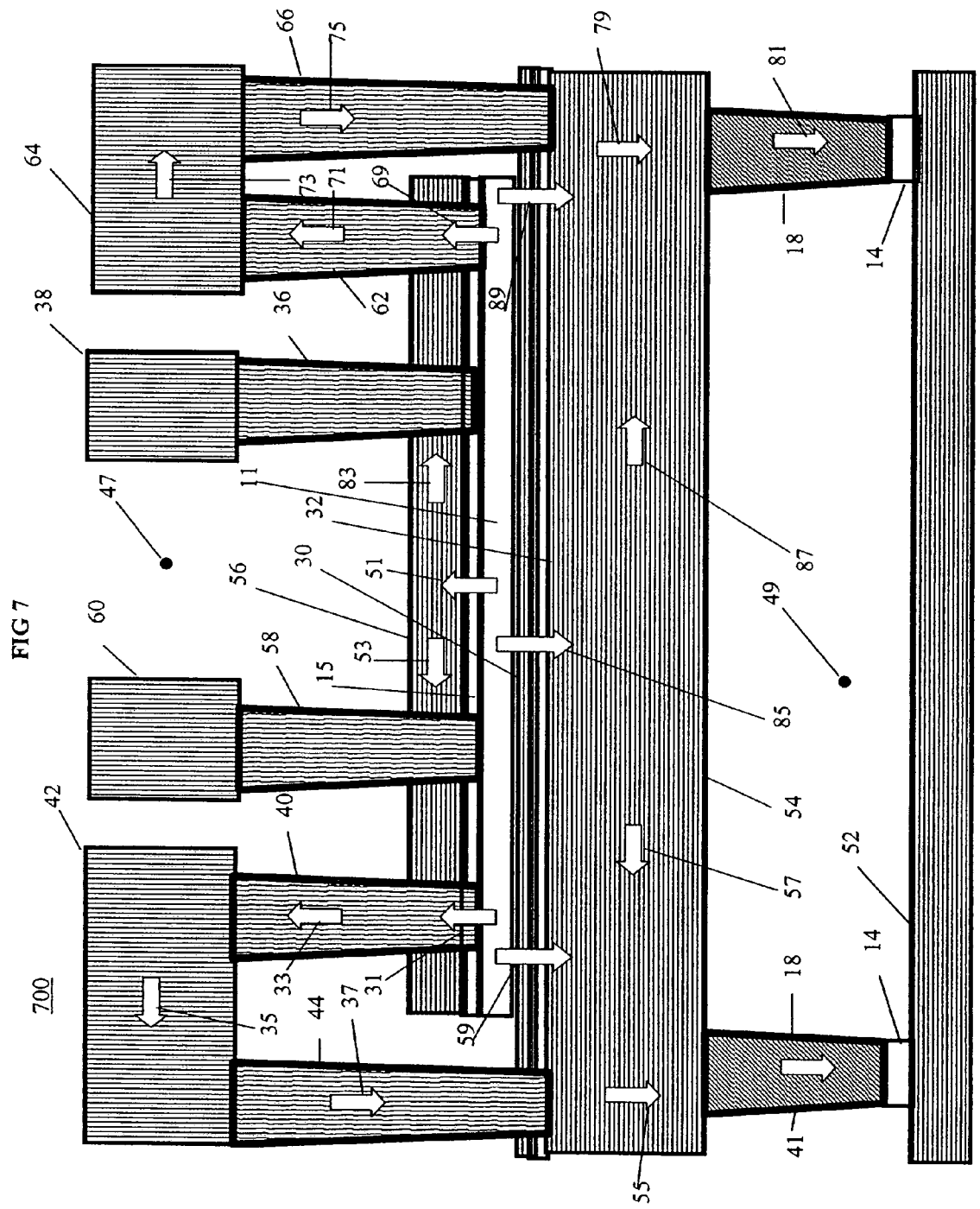
FIG. 7 is a cross-sectional illustration of an embodiment of a resistor connected to a heat sink in accordance with the invention.

Referring to FIG. 7, an embodiment of the resistor with heat sink 700 in accordance with the invention is shown. The resistor with heat sink 700 is a hybrid structure shown in FIGS. 4 and 6. In addition to the features shown in FIG. 6, for example, the resistor with heat sink 700 of FIG. 7 includes a metal substrate 54 positioned between the electrical insulator 32 and the ILD 49, which is arranged on top of a substrate 52. The structure of FIG. 7, however, does not include the second thermal conductor of FIG. 6, which is now represented by the metal substrate.

The resistor with heat sink 700 will have superior high current properties due to the increased mass of the thermal conductive pathways, provided by metal substrate 54. However, in embodiments, the structure 700 will have reduced high frequency response due to parasitic capacitance and other parasitic electrical effect of the metal substrate 54. When electrical current passes through the electrical resistor 11, heat generated by the electrical current passes into the surrounding substrates through the various thermal paths and into the substrate, as discussed with reference to FIG. 6.

For example, heat may flow from the electrical resistor 11 into the high thermal conductivity insulator 56 lengthwise along the thermal path 83 (or 53) towards the heat sink contact 62 (or 40). Using the thermal path 83, as one example, once in the heat sink contact 62, heat may flow along thermal path 71 into the metal contact 64. The heat may flow along thermal path 73 through the metal contact 64 and through the thermal conductor 66 along thermal path 75. Heat may then pass into the metal substrate 54 by passing along thermal path 79 into the heat sink contact 18 along thermal path 81. The heat then passes through the thin high thermal conductivity insulator 14 into the substrate 52.

In addition to the heat paths of FIG. 6, heat may flow from the electrical conductor 10 through the insulator 30 and through the nitride layer 32 into the metal substrate 54 along thermal path 85. Heat may then flow along the length of the thermal substrate 54 along thermal paths 57 and/or 87 and into heat sink contact 18, where it flows along thermal paths 41 and/or 81, respectively, and through the HTCEI film 14 into the substrate 52. A similar heat flow process occurs at the opposite end of the electrical resistor 11.

Figure 8:
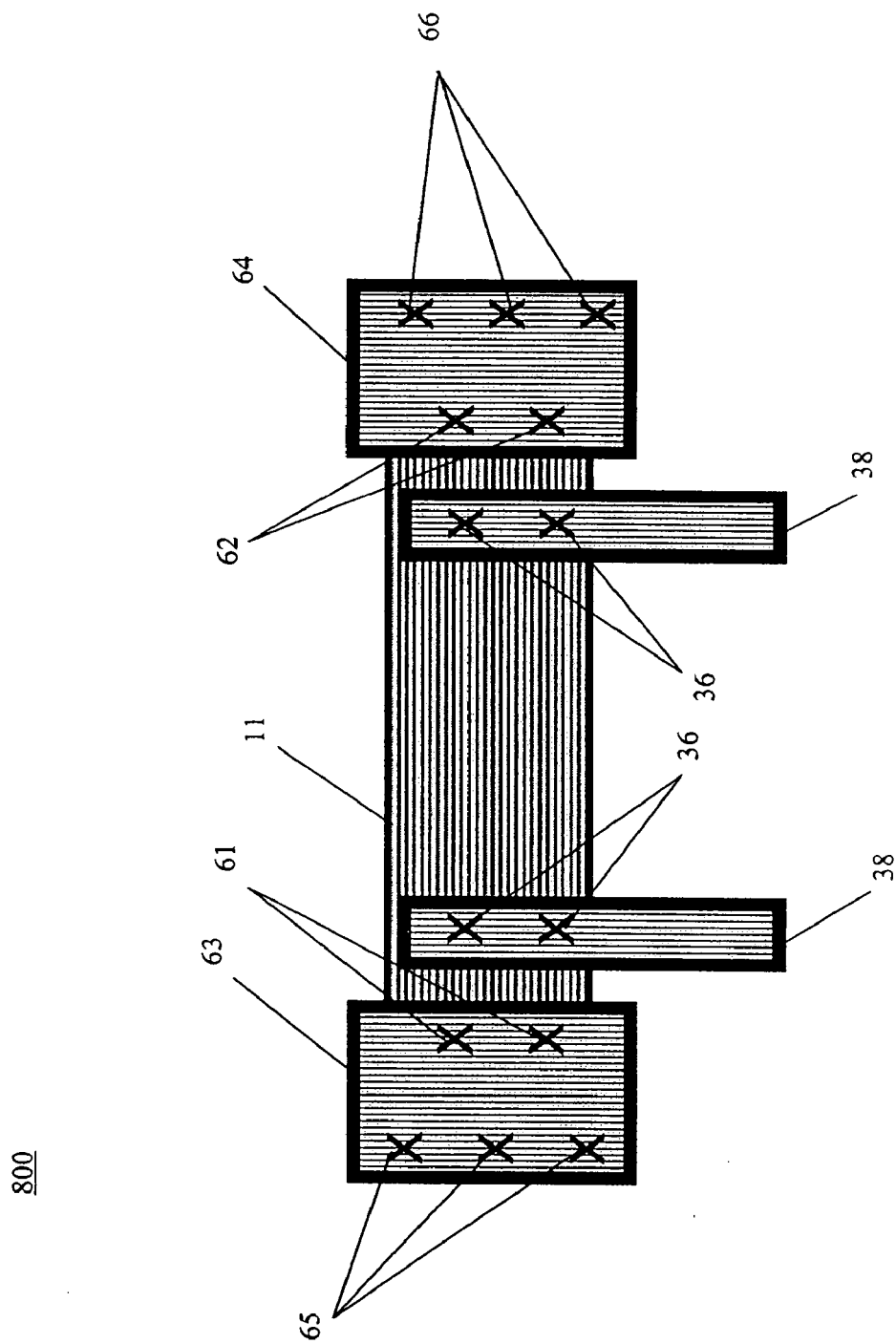
FIG. 8 is a top view illustration of an embodiment of a resistor connected to a heat sink in accordance with the invention.

Referring to FIG. 8, a top of view of an embodiment of a resistor with heat sink structure 800 similar to those of embodiments 600 and 700 is shown. The resistor with heat sink structure 800 includes an electric resistor 10 having metal wires 38 connected to the electrical resistor 11 with electrical contacts 36 located at the electrical input and outputs of the electrical resistor 11. Also included at each end of the electrical resistor 11 are metal contacts 63 and 64. The metal contacts, 63 and 64, are connected to the electrical resistor 11 through heat sink contacts, 61 and 62, respectively. The metal contacts, 63 and 64, are in thermal communication with a heat sink through thermal conductive paths, 65 and 66, respectively.

In operation, the electrical contacts 38 are the current inputs and outputs of the electrical resistor 11. The heat sink contacts, 61 and 62, conduct heat from the electrical resistor 11 into their respective metal contacts 63 and 64. Heat then flows from the metal contacts, 63 and 64, to a heat sink through thermal paths, 65 and 66, respectively.

Figure 9:
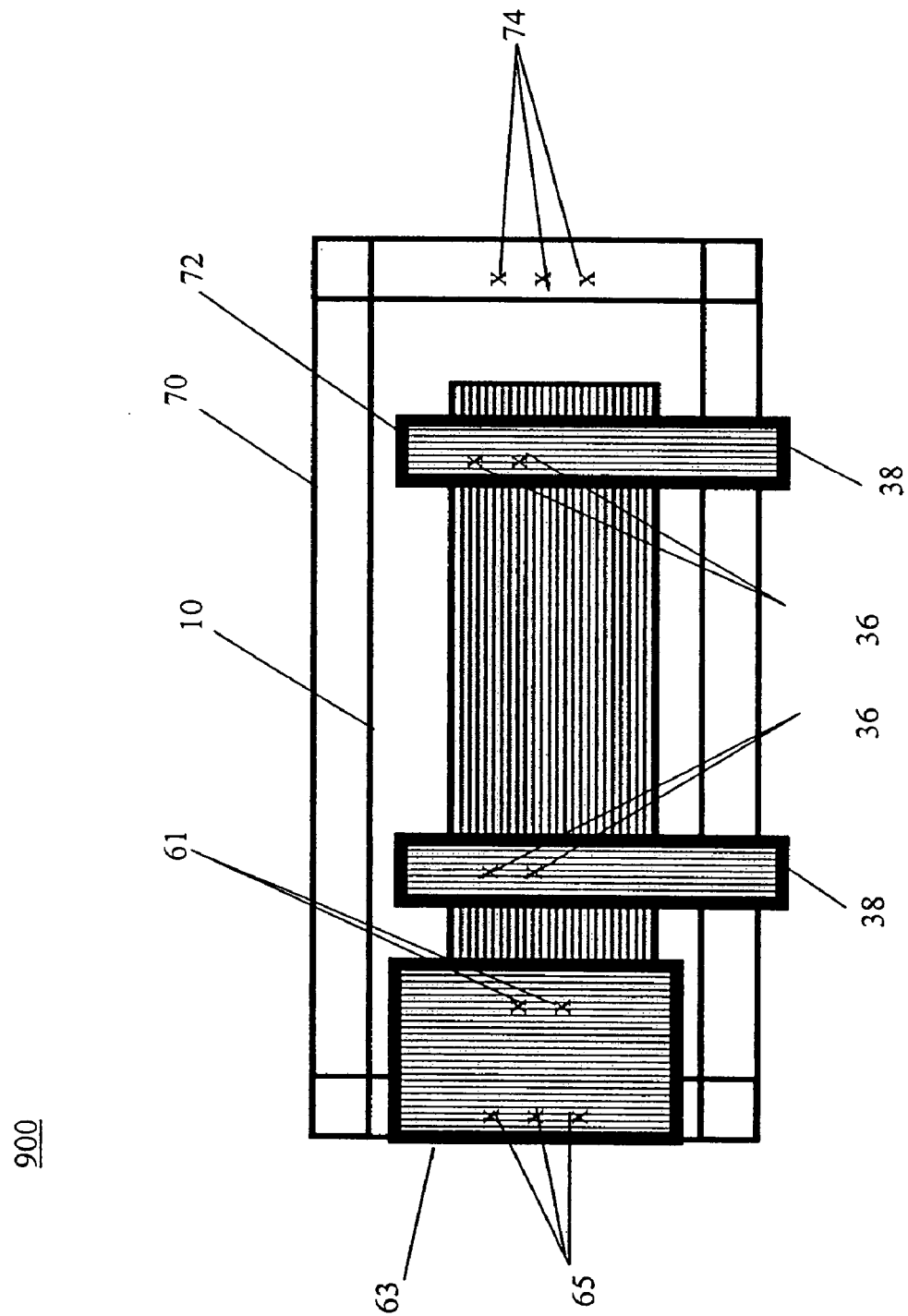
FIG. 9 is a top view illustration of an embodiment of a resistor connected to a heat sink in accordance with the invention.

Referring to FIG. 9, an embodiment of the resistor with heat sink having a metal guard ring 900 in accordance with the invention is shown. The resistor with heat sink 900 includes electric resistor 10 with metal wires 38 connected to the electrical resistor 11 through electrical contacts 36. At one end of the electrical resistor 11 is a metal contact 63. The metal contact 63 is connected to the electrical resistor 11 through a heat sink contact 61. The metal contact 63 is also connected to a metal guard ring 70 through a thermal conductor 65. The metal guard ring 70 is a metal ring, which defines a metal enclosure around the outside of the electrical resistor 11. The metal guard ring 70 is thermally connected to the heat sink through thermal conductor 74. ILD 72 may be placed in the region between the electrical resistor 11 and the metal guard ring 70.

In operation, electrical contacts 36 and metal wires 38 provide an electrical input and output to the electrical resistor 11. Heat generated in the resistor from current flow is conducted out of the electrical resistor 11 and into a heat sink through heat sink contact 61, metal contact 63 and thermal conductor 65 to the guard ring 70. Heat then flows from the guard ring 70 through thermal contact 74 to a heat sink.

Figure 10:
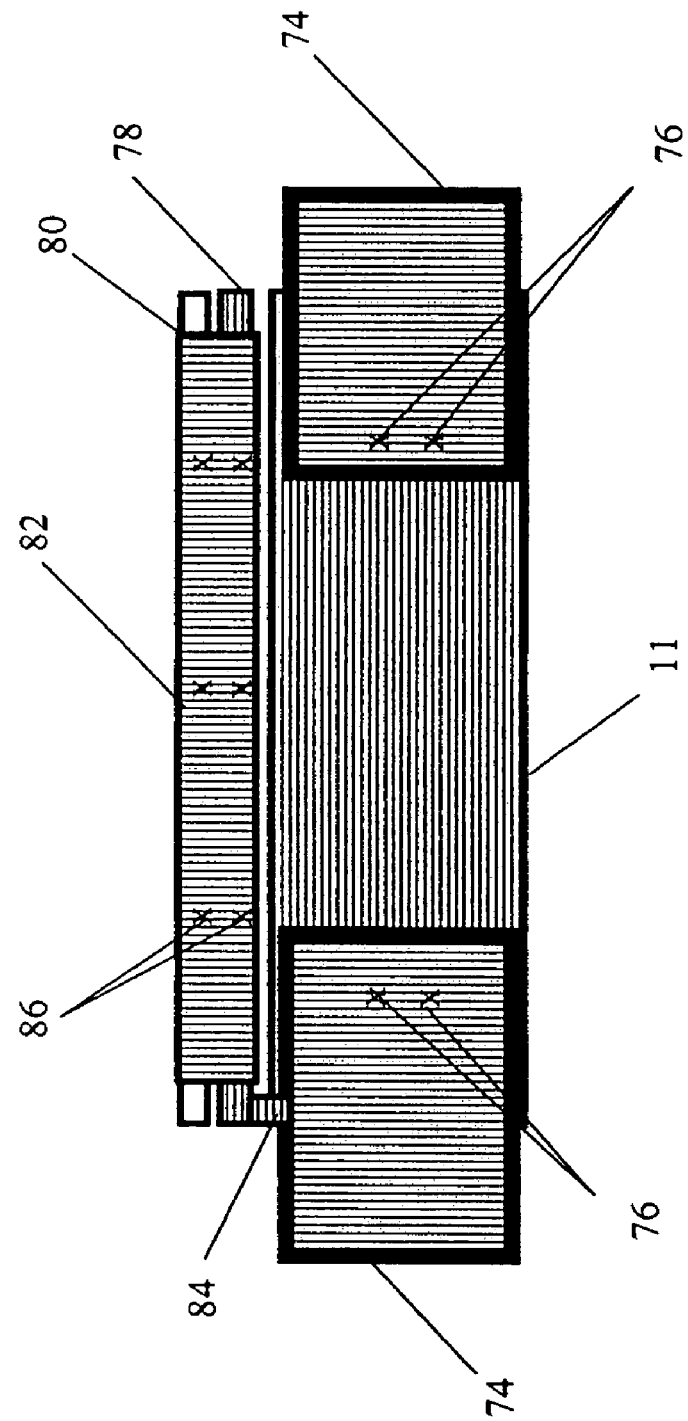
FIG. 10 is a top view illustration of an embodiment of a resistor connected to a heat sink in accordance with the invention.

Referring to FIG. 10, an embodiment of the resistor with a narrow heat sink 1000 is shown. The resistor with narrow heat sink 1000 includes an electrical resistor 11. At each end of the electrical resistor 11 are electrical contacts 74, which are in electrical communication with the electrical resistor 11 through contacts 76.

Additionally, a stub 84 of electrical resistor material is connected to the electrical resistor 11, and a length of electrical resistor material 78 is connected to the stub 84. The electrical resistor material 78 is thermally connected to a metal contact 82 through thermal conductors 86. The thermal conductors 86 also connect the metal connector 82 to a thermal conductor 80 to a heat sink.

In operation, the electrical contact 74 provides input and output to the electrical resistor 11. Heat produced in the electrical resistor 11 from current flowing is conducted away from the electrical resistor 11 by the stub 84 into the electrical resistor material 78. The thermal conductors 86 and metal contact 82 conducts heat from the electrical resistor material 78 of electrical resistor material into the heat sink 80.

While the invention has been described in terms of exemplary embodiments, those skilled in the art will recognize that the invention can be practiced with modifications and in the spirit and scope of the appended claims.

What is claimed is:
1. A method of cooling a resistor, comprising:
    forming a substrate:
    forming a high thermal conductivity electrical insulator on a top surface of the substrate;
    forming a high conductivity insulator having a high thermal conductivity adjacent with and in direct thermal contact with the high thermal conductivity electrical insulator;

forming a via hole in the high conductivity insulator such that a top surface of the high thermal conductivity electrical insulator is exposed through the high conductivity insulator; and forming a heat sink contact in the via hole and directly on top of the top surface of the high thermal conductivity electrical insulator such that the high conductivity insulator surrounds and directly contacts a lower section of the heat sink contact, wherein the direct contact of the heat sink contact with the high thermal conductivity electrical insulator forms a direct thermal contact between the heat sink contact and the high thermal conductivity electrical insulator such that heat is transferred directly between the heat sink contact and the high thermal conductivity electrical insulator;

wherein the direct contact of the high conductivity insulator surrounding the lower section of the heat sink contact forms a direct thermal contact between the high conductivity insulator and the lower section of the heat sink contact such that heat is transferred directly between the high conductivity insulator and the lower section of the heat sink contact; and wherein the high thermal conductivity electrical insulator is in thermal contact with a resistor through the heat sink contact.

2. The method of claim 1, further comprising forming an electrical insulator having a high thermal conductivity in thermal contact with the high thermal conductivity electrical insulator and the high conductivity insulator.

3. The method of claim 2, further comprising forming a longitudinal length of the electrical insulator substantially parallel to a longitudinal length of the resistor.

4. The method of claim 1, further comprising forming an electrical insulator having a high thermal conductivity in thermal contact with the resistor.

5. The method of claim 1, further comprising forming a thermal pathway through the heat sink contacts via a metal contact and into the high thermal conductivity electrical insulator.

6. The method of claim 5, wherein the thermal pathway is directly through the heat sink contacts via the metal contact and into the high thermal conductivity electrical insulator.

7. The method of claim 1, wherein the high thermal conductivity electrical insulator is aluminum oxide ($Al_2O_3$), beryllium oxide, (BeO), cerium oxide ($CeO_2$), or cobalt oxide (CoO).

8. The method of claim 1, wherein the heat sink contact is made from tungsten or copper.

9. The method of claim 1, wherein the heat sink contact is a metal filling the via hole.

10. The method of claim 1, wherein the high thermal conductivity electrical insulator is formed sandwiched between the high conductivity insulator and the substrate.

11. The method of claim 10, further comprising forming an electrical insulator on a top surface of the high conductivity insulator.

12. The method of claim 11, further comprising forming a metal contact on a top surface of the heat sink contact.

13. The method of claim 12, wherein the electrical insulator is formed in direct contact with the top surface of the high conductivity insulator.

14. The method of claim 13, wherein the metal contact is formed in direct contact with the top surface of the heat sink contact.

* * * * *